United States Patent [19]

Arunkumar

[11] Patent Number: 4,675,522
[45] Date of Patent: Jun. 23, 1987

[54] FIBER OPTIC MAGNETIC FIELD SENSOR

[75] Inventor: Koovappadi A. Arunkumar, Costa Mesa, Calif.

[73] Assignee: Spectron Development Laboratories, Inc., Costa Mesa, Calif.

[21] Appl. No.: 785,739

[22] Filed: Oct. 9, 1985

[51] Int. Cl.⁴ ............................................... H01J 5/16
[52] U.S. Cl. ................................... 250/227; 324/244; 356/345
[58] Field of Search ............. 250/227, 231 R; 324/96, 324/244; 356/345

[56] References Cited

U.S. PATENT DOCUMENTS

| 4,591,786 | 5/1986 | Koo et al. | 324/96 X |
| 4,600,885 | 7/1986 | Koo et al. | 324/248 |
| 4,603,296 | 7/1986 | Koo et al. | 356/345 X |

Primary Examiner—Eugene R. LaRoche
Assistant Examiner—James C. Lee
Attorney, Agent, or Firm—Blakely Sokoloff Taylor & Zafman

[57] ABSTRACT

The present invention provides an improved fiber optic magnetometer having particular application for use in environments having large magnetic field ranges and gradients, such as space based applications. The magnetometer includes a laser which generates a coherent beam of light which is split by a beam splitter into first and second beams. The first beam is passed through a single mode fiber optic having a short metallic conductor attached to it. This fiber is referred to as the "sensor arm" of the magnetometer. The second beam is passed through another single mode fiber which is wrapped around a modulator that is coupled to a feedback circuit. This adjusts the magnetometer such that ambient system noise is filtered and the device is maintained at maximum sensitivity. The output of the two fibers is combined forming a Mach-Zehnder interferometer. A current I is passed through the conductor in the sensor arm. If this fiber is in the vicinity of a magnetic field, displacement of the current carrying conductor will cause the fiber to bow. The resulting stretching of the fiber increases the pathlength for the light beam traversing through the sensor arm. The subsequent phase change measured by the Mach-Zehnder is related to the force exerted by the magnetic field on the conductor. The direction in which the fiber bows is dependent upon the magnetic field direction. The present invention also discloses an improved modulator for maintaining the present invention at the point of optimum operation.

15 Claims, 5 Drawing Figures

4,675,522

FIBER OPTIC MAGNETIC FIELD SENSOR

BACKGROUND OF THE INVENTION

1. Field of the Invention:

The present invention relates to magnetometers, and more particularly, to magnetometers based on fiber optic interferometry.

2. Art Background:

As man ventures deeper into space and further explores his planet, the need to measure various physical parameters places increasing demands on state of the art measurement techniques. For example, the present plans to measure planetary, interplanetary and even intergalactic magnetic fields will challenge the capabilities of present day space magnetometers. A variety of methods are known for measuring magnetic fields, including magnetometers based on moving and stationary coils, Hall effect, thin films, flux gates, magnetic resonances, and super conducting devices. It is also known to use light carrying optical fibers for detecting a magnetic field. One method of detection involves passing a beam of polarized light through an optical fiber from one end to the other in the presence of a longitudinal magnetic field, and measuring the extent of rotation (twist) of the plane polarized light. The extent of rotation is dependent upon the prevailing magnetic field. (See for example, U.S. Pat. No. 3,936,742.) Direction of rotation depends upon the direction of the applied field. Using this "Faraday Effect" approach, only large currents and magnetic fields can be detected since the Verdet constant of most doped silica fiber is small. In addition, this approach requires special materials (i.e. silica fiber doped with rare earth ions to enhance the effect), and sophisticated fiber drawing techniques to provide reasonable magnetic field detection sensitivity.

Another approach which has been used in the past employs a Mach-Zehnder interferometer with one of the arms referred to as a sensor arm encoded or wound on a magnetostrictive material (MSM). When exposed to a magnetic field, the MSM undergoes dimensional change thereby altering the path of the beam traversing that fiber. The resulting phase difference between the two beams in the interferometer is directly related to the applied magnetic field. Using this technique, measurement sensitivities on the order of $10^{-15} \times 10^{-9}$ G/m of fiber has been reported. (See for example, U.S. Pat. No. 4,371,838.) However, due to hysteresis effects the response of the MSM to a magnetic field will depend on its previous magnetic history.

In another appoach, a multimode optical fiber is used to detect electrical currents or magnetic fields from a remote source. The optical fiber is composited with metal capable of conducting electricity. Optical radiation is introduced into the fiber from a source which may either be coherent or incoherent. An electrical current is applied to the portion of the electrically conducting optical fiber, and the magnetic field is applied to the current carrying optical fiber. The stretching of the fiber in the presence of a magnetic field induces differential phase shifts in the light between the fiber modes. These phase shifts or losses are detected by a detector and the magnetic field strength thereby determined. (See U.S. Pat. No. 4,348,587.) However, this method does not permit direction or gradient measurement of the magnetic field.

As will be described, the present invention provides a fiber optic magnetometer which overcomes the above-referenced limitations in prior art magnetometers. The present invention employs a Mach-Zehnder interferometer wherein one of the arms of the interferometer includes a metallic conductor attached to the fiber. The presence of a magnetic field is detected by the bowing of the fiber attached to the conductor through which a current is applied. The magnetic field direction may be determined from the current direction and fiber bend. The present invention provides a magnetometer which has been calculated to have sensitivity on the order of $10^{-18}$ Tesla/m. In addition, inasmuch as no ferromagnetic materials are used by the present invention, problems associated with hysteresis effects are avoided.

SUMMARY OF THE INVENTION

The present invention provides an improved fiber optic magnetometer having particular application for use in environments having very small magnetic field ranges and gradients, such as space based applications. The magnetometer includes a laser which generates a coherent beam of light which is split by a beam splitter into first and second beams. The first beam is passed through a single mode fiber optic on which a short metallic conductor is attached. This fiber is referred to as the "sensor arm" of the magnetometer. Current I is passed through the conductor. If the fiber is in the vicinity of a magnetic field, displacement of the current carrying conductor will cause the fiber to bow. The resulting stretching of the fiber increases the pathlength for the light beam traversing through the sensor arm. The change in path length is related to the force exerted by the magnetic field on the conductor. The direction in which the fiber bows is dependent upon the magnetic field direction. The second beam is passed through a single mode fiber wrapped around a modulator that is coupled to a feedback circuit which adjusts the magnetometer such that ambient system noise is filtered, and the device is maintained at maximum sensitivity. The output of the two fibers is then combined thereby forming an interference pattern whereby phase changes in the pattern due to displacement of sensor arm are mathematically converted into field strength and direction data. The present invention also discloses an improved modulator for maintaining the present invention at the point of optimum sensitivity.

DETAILED DESCRIPTION OF THE INVENTION

An improved fiber optic magnetometer is disclosed having particular application for use in detecting wide ranges of magnetic field intensities as well as magnetic field gradients. In the following description for purposes of explanation, particular fibers, system configurations, magnetic field strengths, detectors, etc. are set forth in order to provide a thorough description of the present invention. However, it will be apparent to one skilled in the art that these specific details are not required in order to realize the teachings of the present invention. In addition, various known optical and electrical circuits and components are not set forth in this description in order not to obscure the present invention unnecessarily.

Figure 1:
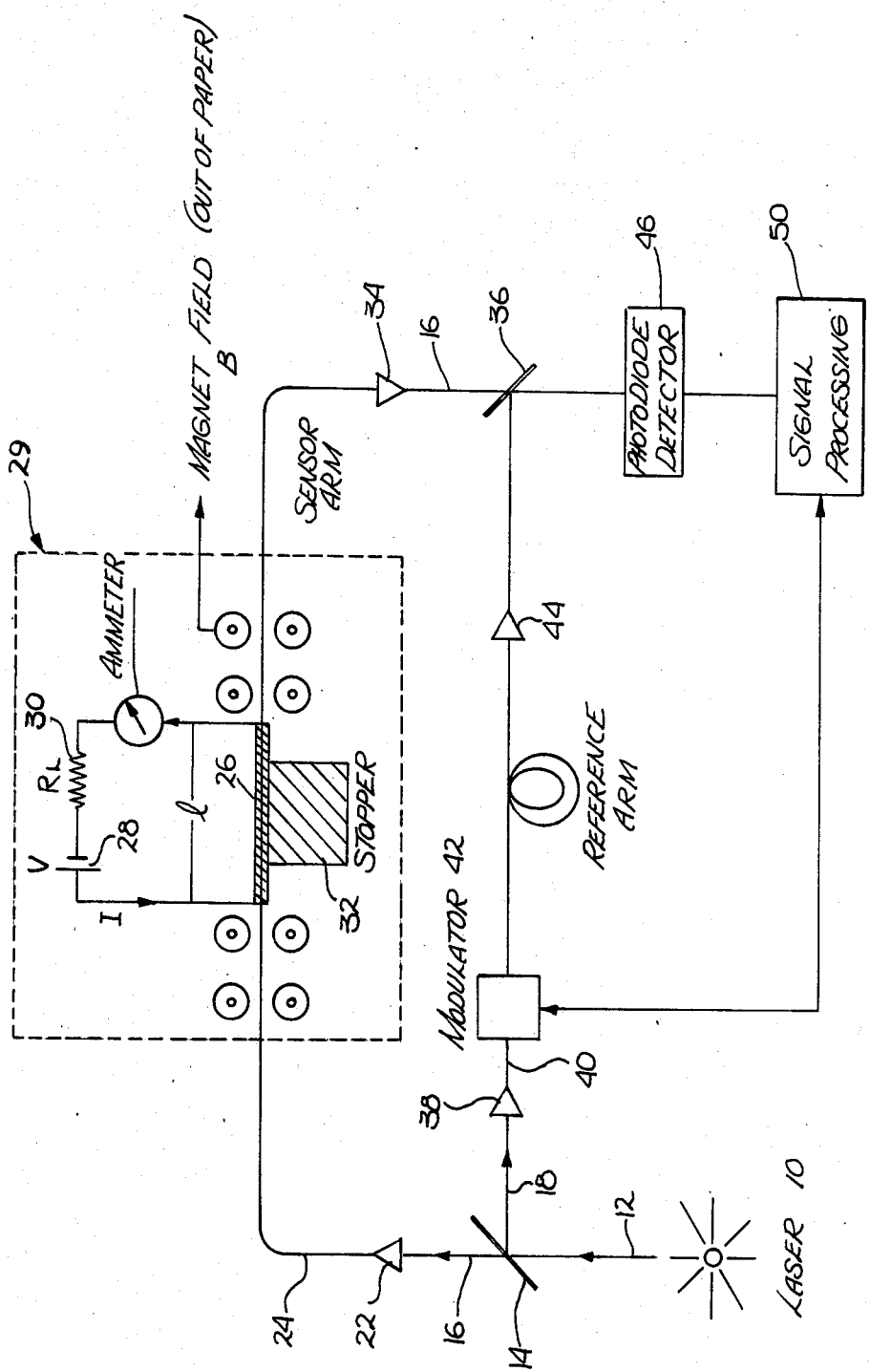
FIG. 1 is a schematic illustration of the present invention disclosing the sensor and reference arms of the magnetometer.

Referring now to FIG. 1, the basic configuration of the present invention's fiber optic magnetometer is disclosed. A laser 10 generates a coherent beam of light 12 which is passed onto a beam splitter 14 thereby generating a first beam 16 and a second reference beam 18, as shown in the diagram. Beam 16 is coupled through an optic coupler 22 such that it passes through a single mode fiber optic 24 comprising the sensing arm of the present invention. As shown, a short metallic (for example aluminum or copper) conductor 26 having length "l" is provided over a portion of fiber 24. The conductor may comprise a metallic coating over the fiber, or the simple mechanical attachment of a metal wire to fiber 24. Metallic conductor 26 is coupled to a circuit which includes a voltage source 28 and a variable resistor 30, to permit a selectable current I to be passed through the conductor. A mechanical stopper 32 is disposed on one side of the fiber to preclude bowing of the fiber in one direction. As will be described, bowing of the fiber 24 is induced by an applied magnetic field, thereby permitting the strength of the field to be determined. The basic components of the sensor arm of the present invention are identified by dashed lines in FIG. 1 and referred to generally by the numeral 29. At the termination of fiber 24, an optic coupler 34 permits beam 16 to exit fiber 24 and incident upon a beam splitter 36.

As illustrated, beam 18 is coupled through an optic coupler 38 to a reference fiber 40. Fiber 40 is attached to a modulator 42 which, as will be described, maintains the present invention at a point known as "phase quadrature" for optimum performance. Beam 18 exits fiber 40 through optic couple 44 and is incident upon beam splitter 36 where it is combined with beam 16. The combined beams are then directed onto a photodiode detector 46 which is coupled to a signal processing system 50. The combining of beams 16 and 18 generates an interference pattern, as is well known, from which using standard electronic technology phase differences between the two beams may be detected.

The present invention determines the strength and direction of a magnetic field based upon the displacement of conductor 26 attached to fiber 24. The direction in which fiber 24 bows is dependent upon a magnetic field direction; provided the current I is unidirectional. Due to the presence of stopper 32, the phase change measurement between beam 16 and 18 may be made only when the fiber bows away from the stopper 32. Accordingly, the magnetic field direction may be inferred once the current flow direction is known.

Figure 4:
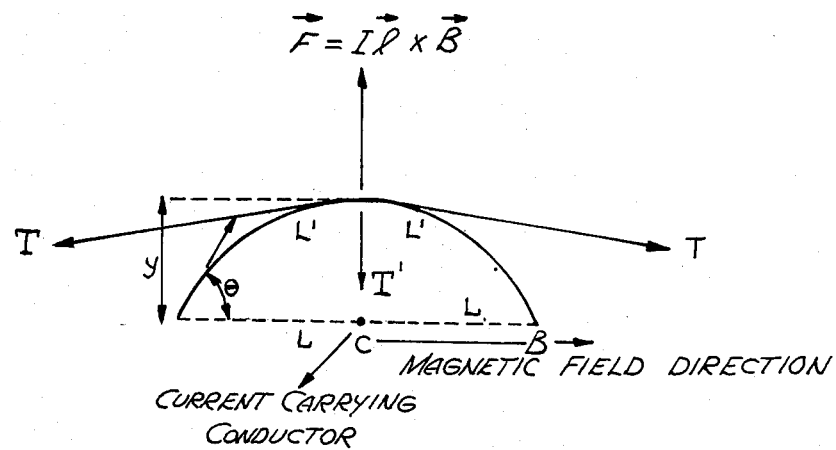
FIG. 4 is a graph illustrating the forces acting upon the sensor arm when the fiber is displaced in the presence of a magnetic field.

If I is defined as the current passing through conductor 26 (referred to as "C") having length ("l"), then the force exerted on it by the unknown magnetic field B is $$\vec{F} = \vec{Il} \times \vec{B} = IB_\perp \tag{A}$$

Where $B_\perp$ is the magnetic field that is perpendicular to the conductor 26. The force $\vec{F}$ displaces the conductor in a direction determined by the above equation (A), resulting in the bowing and stretching of the fiber 24. The resulting phase difference between beam 16 and 18 is $$\delta\phi = \frac{2\pi}{\lambda} \delta L \tag{B}$$

Where $\delta L$ is the extra path induced in fiber 24. For small displacement y, the graph illustrated in FIG. 4 may be approximated to a triangle. If 2L is the length of the sensor arm then $$\delta\phi = \frac{2\pi}{\lambda}(2L' - 2L) = \frac{2\pi}{\lambda}\{2\sqrt{y^2 + L^2} - 2L\} \tag{C}$$

and $$y = \left(\frac{L\lambda}{2\pi}\right)^{\frac{1}{2}} \delta\phi^{\frac{1}{2}} \tag{D}$$

Under equilibrium conditions, $\vec{F} = T' = 2T\sin\theta$, where T is the tension in the fiber. The Young's modulus of the stretched fiber $$Y = \frac{T/\pi r^2}{\delta L/2L} \tag{E}$$

where r is the fiber core radius. From the above equations (B) and (D) we have $$\delta\phi = \frac{2\pi}{\lambda} \frac{2L}{y} \frac{T}{\pi r^2} \tag{F}$$

using the relations $T = F/2\sin\theta$ and $\sin\theta = y/\sqrt{y^2 + L^2}$, we have for the phase difference $$\delta\phi = \frac{2\pi}{\lambda} \frac{2L}{y} \frac{F}{2Y} \frac{\sqrt{y^2 + L^2}}{\pi r^2} \tag{G}$$

combining equations (A), (D), and (G), we get $$IB_\perp = \left(\frac{\lambda}{2\pi L}\right)^{3/2} \cdot \left(\frac{y}{l}\right) \cdot \pi r^2 \cdot (\delta\phi)^{3/2} \tag{H}$$

Where it is assumed that $L \approx L'$ for small values of y. The units of the above equation (H) is Tesla amp in the MKS system.

It will be appreciated by one skilled in the art that the sensitivity of the present invention may be varied by varying the magnitude of the current I. For weak magnetic fields the quantity $IB_\perp$ may be enlarged by increasing the value of current I. Similarly, in large magnetic fields (for example in the vicinity of a large planet such as Jupiter), the value of $IB_\perp$ may be reduced by lowering the value of current I. It will be noted that the present invention is capable of determining the direction of the applied magnetic field by simply changing the direction of current I and rotating the sensor arm. For example, if in the illustration of FIG. 1 the magnetic field direction is reversed, the present invention in its illustrated orientation may detect the field and note its direction despite the presence of stopper 32 simply by reversing the direction of current I. Magnetic fields in other directions may be detected by appropriately rotating the sensor arm (for example on a rotatable external spacecraft platform) such that magnetic field directions in all XYZ directions may be determined.

Assuming electronic phase difference detectability of $10^{-6}$ radians, the smallest field which may be sensed by the present invention may be estimated. For a 1 centimeter long (l) conductor 26 attached to a silica fiber having a core diameter of 4 microns, length $2L = 1$ m and $Y = 0.55 \times 10^{11}$ N/m$^2$, and an operating wavelength of 0.63 microns, the minimum detectable field will be $6.2 \times 10^{-18}$ Tesla or $6.2 \times 10^{-14}$ Gauss for 1 ampere current through the conductor 26. If the 1 amp current provides thermal problems, the magnetometer may be operated in a pulsed mode. Problems associated with Ohmic heating may also be reduced or eliminated if the value of I is lowered. However, the lowering of I would affect the detection sensitivity. Thus, for $I = 1$ mA, the minimum detectable field is of the order of $10^{-11}$ Gauss/meter of the fiber. In the event that phase detectability of the present invention drops to a milliradian, the field detectability accordingly drops to $2 \times 10^{-9}$ Gauss/m/A; which at the present time is approximately an order of magnitude better than most prior art systems.

Figure 5:
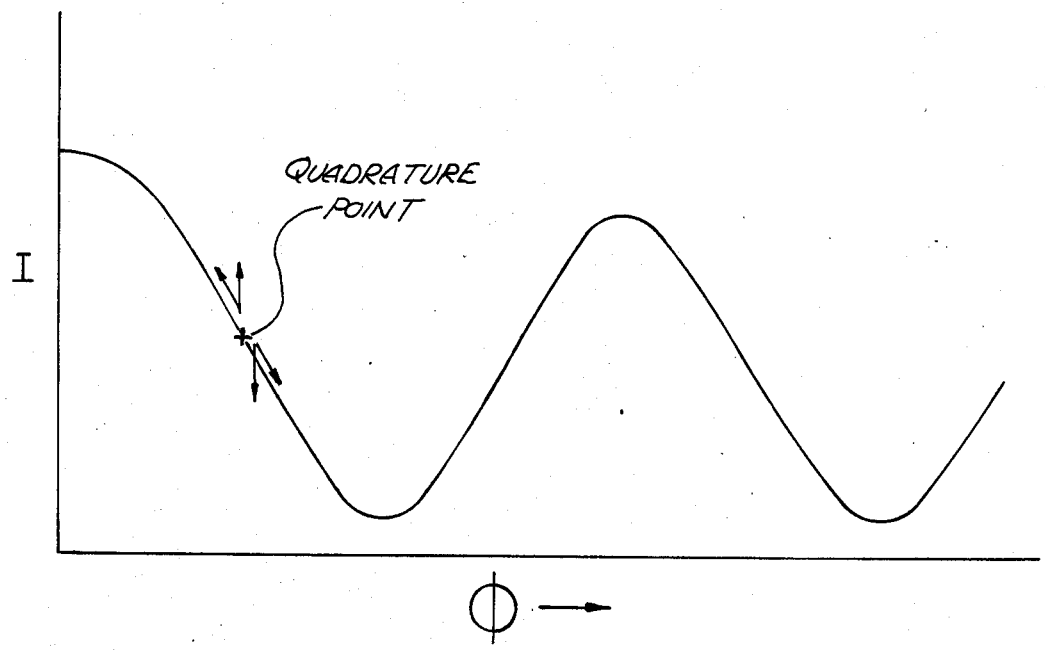
FIG. 5 is a graph illustrating the quadrature point where small phase difference changes induce the greatest intensity changes in the present invention's output.

Inasmuch as the parameter detected by the present invention is the extra phase induced in the sensor arm by a magnetic field, measurement of the phase changes is rendered more difficult by phase noises induced in the sensor and reference arms by external perturbations. For maximum sensitivity whereby differences in phase induce the greatest intensity changes in the interference pattern generated by combined beams 16 and 18, the present invention should be retained at the "quadrature" point illustrated in FIG. 5. Fibers 24 and 40 comprise single mode polarization insensitive fibers, which are commercially available. The electric field of the light beam in the sensor arm just prior to optic coupler 34 may be described as $$E_s = E_s° \exp i \{\omega t + S(t) \theta_s\}$$

and the electric field at the corresponding point in the reference arm, just prior to optic coupler 44 will be $$E_r = E_r° \exp i \{\omega t + 100 \ \}$$

typically, the signal $S(t) << \pi$. The arbitrary phase factors. $\theta s$ and $\theta r$ will be constant under ideal conditions. However, they may drift in a random manner and the amplitude of this drift may be of the order of $2\pi$ or greater. To extract information about $S(t)$ fom this phase noise, modulator terms (the variables A and B) are included in the phase of the reference beam.

$$E_r = E_r° \exp i \{\omega t + A(t) + B(t) + \theta r\}$$

Figure 2:
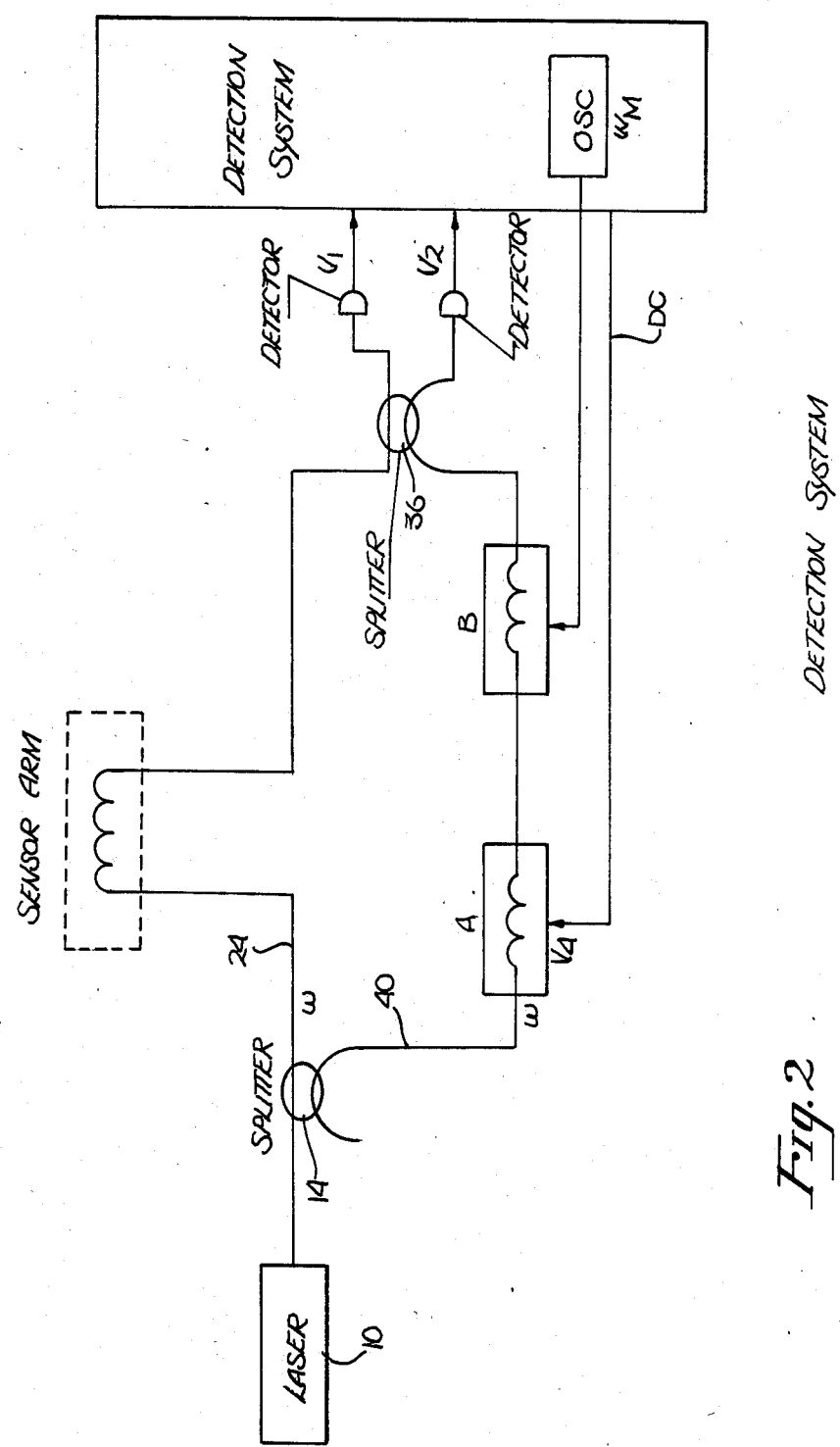
FIG. 2 is a schematic illustration of the present invention using prior art piezo-electric modulators to maintain the system at a quadrature point.

These terms are generated by stretching sections of fiber wound on a piezoelectric element, as illustrated in FIG. 2, and is known in the art. The piezoelectric element is generally in the shape of a small drum which expands and contracts in accordance with the signal applied to it. The expansion and contraction of the piezoelectric element stretches and contracts that section of fiber 40 wrapped around the element. Phase A represents a phase produced by a feedback circuit to hold the interferometer at the quadrature condition.

The phase B is always of the form $\theta_m \sin\omega_m t$. Depending upon the type of detection system actually used, either A, B, or both, or neither may be required in a particular application in order to exclude noise from the system. The signal to be detected can be obtained from the output of the feedback circuit which keeps the interferometer in quadrature. The electronic circuitry and archiecture nee needed for the feedback controls is well known and hence will not be discussed herein. The following references provide the necessary reading required to develop such circuits: "Control Action", Van Nostrand's Scientific Encyclopedia, 5th Ed., pgs. 662-669, 1976, "Control Algorithm", McGraw-Hill Encyclopedia of Electronics and Computers, pgs. 223-224, 1984; "Position Sensing Photodetectors", United Detector Technology, Techanical Brochurre, 1984.

Figure 3:
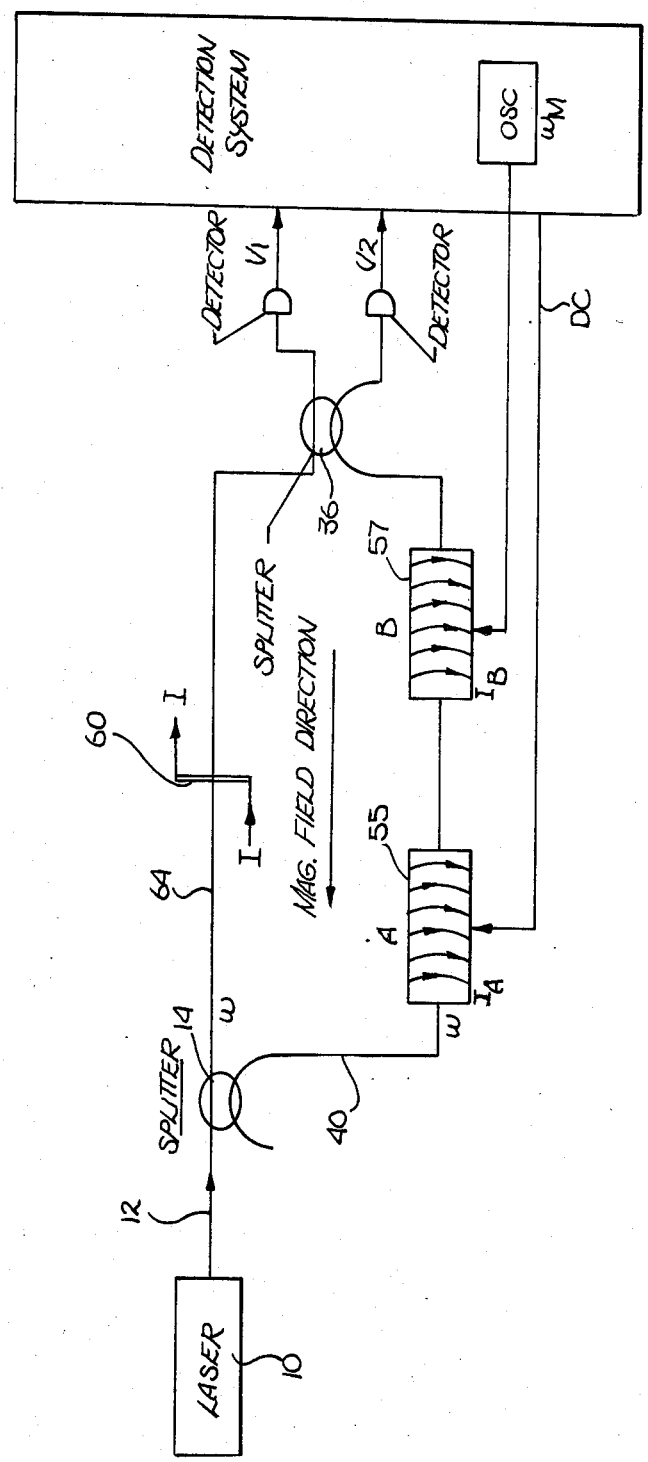
FIG. 3 is a schematic illustration of another embodiment of the present invention in which a conductor is attached perpendicular to the fiber and an improved modulator is employed.

Referring now to FIG. 3, the present invention provides an alternate method than that illustrated in FIG. 2 to generate the phase factors A(t) and B(t). The modulators 55 and 57 utilized by the present invention comprise a portion of fiber 40 coated with metal within each modulator and wound onto drums formed out of a nonmetallic material. By keeping the drum axis parallel to the magnetic field, A(t) may be generated by passing an appropriate DC current through modulator 55, and in modulator 57 [for B(t)]by passing a sinusoidal current of appropriate frequency through the metallic coating over the fiber within modulator 57. Accordingly, the modulators utilized by the present invention are significantly less expensive than those illustrated in FIG. 2.

In addition, in FIG. 3 an alternate embodiment of the present invention is illustrated. A conductor 60 may be mechanically bonded to fiber 24 such that the conductor lies perpendicular to fiber. A current I passing through the conductor 60 will in the presence of a magnetic field, force the conductor to displace the fiber in a direction dependent upon the magnetic field and current directions, as is well known. The mathematical description previously set forth relative to the embodiment of FIG. 1 is equally applicable to the embodiment of FIG. 3, and appropriate stoppers and circuitry may be provided as in the preceeding Figures to permit the magnitude and direction of the applied magnetic field to be determined.

The present invention may also be used to detect gradients within magnetic fields. Unlike some prior art systems which could not be "turned off" such that the sensor and reference arms responded identically (by simply eliminating the current I passing through the conductor 26 or 60), the present invention has such capability. By providing a similar conductor 26 and appropriate circuitry on fiber 40 comprising a reference arm, one arm may be used as a reference arm, or alternatively, as a sensor arm. Balancing of the two arms to nullify the effect of time varying spatially coherent signals and/or magnetic noises may be done by adjusting the length of conductors on each arm. It will be appreciated that in the aforementioned embodiment of the present invention permitting the measurement of magnetic gradients either arm of the invention may be used as a reference, or alternatively, a sensor arm by providing or eliminating, as may be required, the current I passing through the conductor 26.

Accordingly, an improved fiber optic magnetometer has been described. Although the invention has been described with particular reference to FIGS. 1 through 5, it will be appreciated that the Figures are for illustration only and do not limit the invention. For example, the present invention may be used to measure current through a conductor as well as magnetic field strength. Since it is well known that a current passing through a conductor generates a magnetic field, by disposing the present invention adjacent to a conductor passing a current, the current may be determined based on the measured magnetic field strength induced around the conductor. Moreover, the present invention may be used as a temperature sensor by eliminating the current I passing through conductor 26 or 60, inasmuch as the metal comprising conductors 26 or 60 will expand when heated and thereby stretch fiber 24. The temperature may be determined based on induced phase change between beams 16 and 18 which is a function of the amount of expansion of the conductor in the embodiment of FIG. 1. Using the present invention for purposes of determining temperature, permits sensitivities of $10^{-8}$ Centigrade up to the melting temperature of the fiber which is approximately 1,000 Centigrade.

I claim:

1. A fiber optic transducer comprising:
   light generation means for generating first and second coherent beams of light;
   a first single mode optical fiber optically coupled to said first beam, said first optical fiber having a non-magnetic metallic conductor attached to a portion of said fiber;
   current generating means coupled to said conductor for selectively passing a current I through said conductor;
   a second single mode optical fiber optically coupled to said second beam;
   light combining means in optical alignment with said first and second beams after said beams pass through said respective fibers for combining said beams and forming an interference pattern between said beams;
   sensing means for sensing phase differences between said combined beams from said interference pattern, said phase differences resulting from the physical displacement of said first optical fiber in the presence of a magnetic field B from said current I passing through said non-magnetic conductor in the presence of said magnetic field, said conductor returning to its original position once said magnetic field B is removed.

2. The transducer as defined by claim 1, wherein said non-magnetic conductor has a length l.

3. The transducer as defined by claim 2, further including modulator means coupled to said second optical fiber for selectively altering the path length of said second fiber to cancel spurious noise signals in said transducer, and maintain said transducer at a quadrature point.

4. The transducer as defined by claim 3, further including a stopper disposed adjacent to said metallic conductor to limit movement of said first fiber to one direction.

5. The transducer as defined by claim 4, wherein said sensing means includes photodiode detectors.

6. The transducer as defined by claim 5, wherein said metallic conductor is disposed longitudinally along said first fiber.

7. The transducer as defined by claim 5, wherein said metallic conductor is disposed perpendicular to said first fiber.

8. The transducer as defined by claim 3, wherein the magnetic field strength B is determined from the expression:

$$IB\perp = \left(\frac{\lambda}{2\pi L}\right)^{3/2} \cdot \left(\frac{Y}{l}\right) \cdot \pi r^2 \cdot (\delta\phi)^{3/2}$$

where:
   I = current passing through said conductor attached to a portion of said first fiber;
   λ = wavelength of said first and second coherent beams of light;
   L = length of said first fiber;
   l = length of said conductor;
   r = radius of said first and second fibers;
   δφ = phase difference between said first and second beams sensed by said sensing means.

9. The transducer as defined by claim 8, wherein said phase differences between said first and second beams sensed by said sensing means is defined by:

$$\delta\phi = \frac{2\pi}{\lambda}\delta L$$

where:
   67 L = extra path length induced in said first fiber by a magnetic field B through physical displacement.

10. The transducer as defined by claim 9, wherein said light generation means comprises a laser.

11. A method for sensing physical parameters in an ambient environment using a fiber optic transducer comprising the steps of:
   generating first and second coherent beams of light;
   passing said first beam through a single mode optical fiber having a non-magnetic metallic conductor attached to a portion of said fiber;
   passing said second beam through a second single mode optical fiber;
   combining said first and second beams passed through said respective fibers to form an interference pattern between said beams;
   sensing phase differences between said beams, said phase differences resulting from the physical displacement of said first optical fiber in the presence of a magnetic field B from said current passing through said non-magnetic conductor in the presence of said magnetic field, said conductor returning to its original position once said magnetic field B is removed.

12. The method as defined by claim 11, further including the step of selectively altering the path length of said second fiber to cancel spurious noise signals in said transducer, and maintain said transducer at a quadrature point.

13. The method as defined by claim 12, including the step of limiting the physical displacement of said first fiber to one direction.

14. The method as defined by claim 11, wherein magnetic field strength B is derived from the expression:

$$IB\perp = \left(\frac{\lambda}{2\pi L}\right)^{3/2} \cdot \left(\frac{Y}{l}\right) \cdot \pi r^2 \cdot (\delta\phi)^{3/2}$$

where:
- I = current passing through said conductor attached to a portion of said first fiber;
- $\lambda$ = wavelength of said first and second coherent beams of light;
- L = length of said first fiber;
- l = length of said conductor;
- r = radius of said first and second fibers;
- $\delta\phi$ = phase difference between said first and second beams sensed by said sensing means.

15. The method as defined by claim 14, wherein said phase differences between said first and second beams sensed by said sensing means is defined by:

$$\delta\phi = \frac{2\pi}{\lambda} \delta L$$

where:
- $\delta L$ = extra path length induced in said first fiber by an ambient magnetic field B through physical displacement.

* * * * *

UNITED STATES PATENT AND TRADEMARK OFFICE
CERTIFICATE OF CORRECTION

PATENT NO. : 4,675,522

DATED : 6/23/87

INVENTOR(S) : ARUNKUMAR

It is certified that error appears in the above-identified patent and that said Letters Patent is hereby corrected as shown below:

| COLUMN | LINE | DESCRIPTION |
|---|---|---|
| 5 | 48 | delete "$\{\omega t + 100\}$" insert --$\{\omega t + \phi_r\}$-- |
| 5 | 53 | delete "fom" insert --from-- |
| 7 | 52 | insert --metallic-- between "non-magnetic" and "conductor" |

Signed and Sealed this

Sixth Day of September, 1988

Attest:

DONALD J. QUIGG

Attesting Officer

Commissioner of Patents and Trademarks